United States Patent
Kiuchi et al.

(10) Patent No.: US 7,029,550 B2
(45) Date of Patent: Apr. 18, 2006

(54) ENERGY-BEAM-CURABLE THERMAL-RELEASABLE PRESSURE-SENSITIVE ADHESIVE SHEET AND METHOD FOR PRODUCING CUT PIECES USING THE SAME

(75) Inventors: Kazuyuki Kiuchi, Osaka (JP); Toshiyuki Oshima, Osaka (JP); Akihisa Murata, Osaka (JP); Yukio Arimitsu, Osaka (JP)

(73) Assignee: Nitto Denko Cororation, Osaka (JP)

( * ) Notice: Subject to any disclaimer, the term of this patent is extended or adjusted under 35 U.S.C. 154(b) by 326 days.

(21) Appl. No.: 10/399,476

(22) PCT Filed: Oct. 17, 2001

(86) PCT No.: PCT/JP01/09115

§ 371 (c)(1),
(2), (4) Date: Apr. 18, 2003

(87) PCT Pub. No.: WO02/33018

PCT Pub. Date: Apr. 25, 2002

(65) Prior Publication Data

US 2004/0000370 A1 Jan. 1, 2004

(51) Int. Cl.
*B32B 31/28* (2006.01)
*C09J 7/02* (2006.01)

(52) U.S. Cl. .............. 156/272.2; 156/275.5; 156/275.7; 428/40.2; 428/41.8; 428/42.3; 428/200; 428/202; 428/343; 428/345; 428/352; 428/355 R; 428/355 BL

(58) Field of Classification Search .......... 428/40.2, 428/41.8, 42.3, 200, 202, 343, 345, 352, 428/355 R, 355 RA, 355 BL; 156/272.2–275.7
See application file for complete search history.

(56) References Cited

U.S. PATENT DOCUMENTS 5,441,810 A * 8/1995 Aizawa et al. .............. 428/354
2004/0003883 A1 1/2004 Kiuchi et al.

FOREIGN PATENT DOCUMENTS

EP 0612823 A1 8/1994

(Continued)

OTHER PUBLICATIONS

Patent Abstract of Japan vol. 1999, No. 11, Sep. 30, 1999.

(Continued)

*Primary Examiner*—Sam Chuan Yao
(74) *Attorney, Agent, or Firm*—Sughrue Mion, PLLC

(57) ABSTRACT

An energy-beam-curable thermal-releasable pressure-sensitive adhesive sheet has, on at least one side of a base material, an energy-beam-curable viscoelastic layer and a thermo-expandable pressure-sensitive adhesive layer containing thermo-expandable microspheres stacked in this order. The energy-beam-curable viscoelastic layer is, for example, composed of a composition of an organic viscoelastic body and an energy-beam-curable compound or an energy-beam-curable resin. The energy-beam-curable viscoelastic layer has a thickness of about 5 to 300 μm or may be not greater than the maximum particle size of the thermo-expandable microspheres. The energy-beam-curable thermal-releasable pressure-sensitive adhesive layer according to the invention has adhesion enough to withstand a carrying step of an adherend, causes neither winding up of the adhesive nor chipping upon cutting and facilitates peeling and collection of cut pieces after cutting.

7 Claims, 1 Drawing Sheet

FOREIGN PATENT DOCUMENTS

| | | |
|---|---|---|
| EP | 1 033 393 A2 | 6/2000 |
| JP | 11-166164 A | 6/1999 |
| WO | WO 00/18848 | 4/2000 |

OTHER PUBLICATIONS

International Search Report dated Apr. 3, 2002.

* cited by examiner

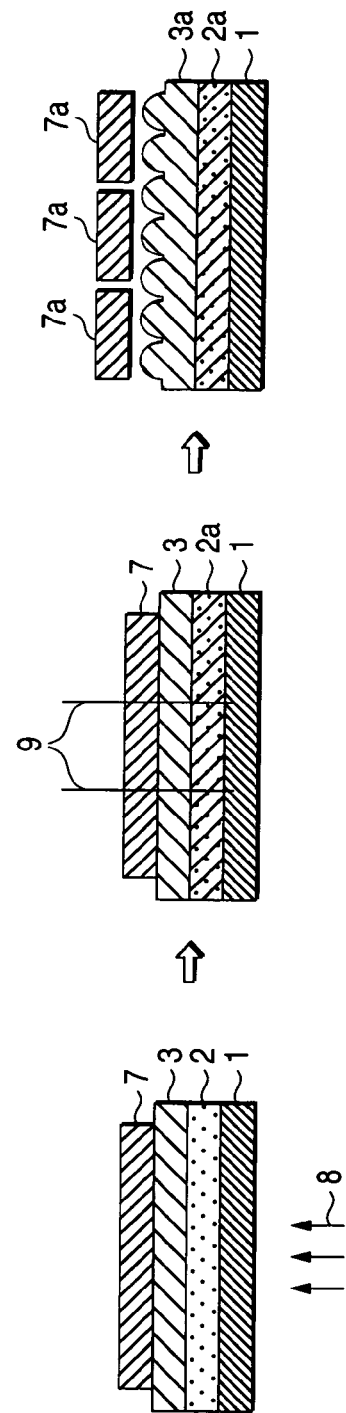
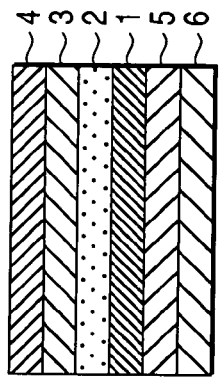
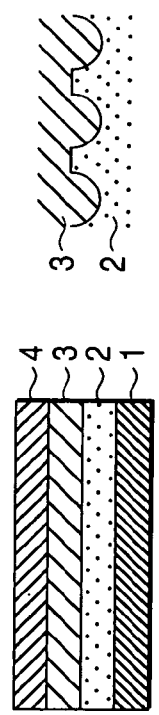

ENERGY-BEAM-CURABLE THERMAL-RELEASABLE PRESSURE-SENSITIVE ADHESIVE SHEET AND METHOD FOR PRODUCING CUT PIECES USING THE SAME

TECHNICAL FIELD

The present invention relates to an energy-beam-curable thermal-releasable pressure-sensitive adhesive sheet from which cut pieces, which are adherends, can readily be released and collected by irradiation with energy beams and heat treatment; and a method for producing cut pieces using this sheet.

BACKGROUND ART

Upon cutting a semiconductor wafer or multilayer capacitor sheet into pieces of a predetermined size, conventionally known as a pressure-sensitive adhesive sheet for causing it to adhere to the wafer or sheet (adherend) and facilitating release and collection of cut pieces such as cut chips is a thermal-releasable pressure-sensitive adhesive sheet having a blowing-agent-containing pressure-sensitive adhesive layer disposed on a high elastic film or sheet base material such as plastic (JP-B-50-13878, JP-B- 51-24534, JP-A-56-61468, JP-A-56-61469, JP-A-60-252681, etc.). This thermal-releasable pressure-sensitive adhesive sheet is aimed at both retention of adhesion enough for withstanding cutting of the adherend and easy release and collection of the cut pieces. Described specifically, this sheet is caused to adhere to the adherend with high adhesion, but upon collection of the cut pieces, the cut pieces can be released easily, because the expandable pressure-sensitive adhesive layer containing thermo-expandable microspheres foams or expands by heating and roughens the surface of the pressure-sensitive adhesive layer, leading to lowering or loss of adhesion due to a decrease in the adhesion area with the adherend.

Since the above-described thermal-releasable pressure-sensitive adhesive sheet has a soft and thick adhesive layer, however, problems such as winding up of the adhesive by a cutting blade or chipping associated with vibration of the pressure-sensitive adhesive layer occur upon cutting of the adherend. Thinning of the pressure-sensitive adhesive layer is effective for overcoming the above-described problems. If the layer is made thinner than the diameter of the thermo-expandable microspheres, however, these microspheres protrude from the surface of the layer and impair its smoothness, making it impossible to exhibit adhesion enough to retain the adherend. Then, the sheet fails to serve as a pressure-sensitive adhesive sheet.

DISCLOSURE OF THE INVENTION

An object of the present invention is therefore to provide an energy-beam-curable thermal-releasable pressure-sensitive adhesive sheet which has adhesion enough to withstand a transporting step after a step such as bonding or cutting of an adherend, causes neither winding up of the adhesive nor pitching upon a cutting step, and facilitating release and collection of cut pieces; and a method for producing cut pieces using this pressure-sensitive adhesive sheet.

As a result of extensive investigation with a view toward attaining the above-described object, the present inventors have found that when an energy-beam-curable viscoelastic layer and a thermo-expandable adhesive layer are stacked one after another in this order over at least one side of a base material, the winding up or chipping of the adhesive can be inhibited upon a cutting step while keeping adhesion to the adherend, and at the same time, cut pieces can be readily released and collected, leading to the completion of the invention.

In one aspect of the invention, there is thus provided an energy-beam-curable thermal-releasable pressure-sensitive adhesive sheet having, over at least one side of a base material, stacked an energy-beam-curable viscoelastic layer and a thermo-expandable pressure-sensitive adhesive layer containing thermo-expandable microspheres in the order of mention.

In another aspect of the invention, there is thus provided a method for producing cut pieces, which comprises applying a material to be cut on the surface of the thermo-expandable pressure-sensitive adhesive layer of the above-described energy-beam-curable thermal-releasable pressure-sensitive adhesive sheet, irradiating the energy-beam-curable viscoelastic layer with energy beams, thereby curing the layer, cutting the material into pieces, causing the thermo-expandable pressure-sensitive adhesive layer to foam by heating and releasing and collecting the cut pieces.

In a further aspect of the invention, there is also provided a method for producing cut pieces, which comprises irradiating the above-described energy-beam-curable thermal-releasable pressure-sensitive adhesive sheet with energy beams, thereby curing the energy-beam-curable viscoelastic layer, applying a material to be cut on the surface of the thermo-expandable pressure-sensitive adhesive layer, cutting the material into pieces, causing the thermo-expandable pressure-sensitive adhesive layer to foam by heating, and releasing and collecting the cut pieces.

BRIEF DESCRIPTION OF THE DRAWINGS

FIG. 1 is a schematic cross-sectional view illustrating one example of the energy-beam-curable thermal-releasable pressure-sensitive-adhesive sheet of the invention.

FIG. 2 is a schematic cross-sectional view illustrating another example of the energy-beam-curable thermal-releasable pressure-sensitive-adhesive sheet of the invention.

FIG. 3 is a schematic view illustrating one example of the manufacturing process of cut pieces of the invention.

BEST MODE FOR CARRYING OUT THE INVENTION

The embodiments of the invention will hereinafter be described in detail with reference to accompanying drawings if necessary. FIG. 1 is a schematic cross-sectional view illustrating one example of the energy-beam-curable thermal-releasable pressure-sensitive adhesive sheet of the invention. In this example, an energy-beam-curable viscoelastic layer 2 is disposed on one side of a base material 1 and stacked thereover are a thermo-expandable pressure-sensitive adhesive layer 3 and a separator 4 in this order. The pressure-sensitive adhesive sheet relating to the invention may be in any known or conventionally-used form such as sheet or tape as needed.

The base material 1 serves as a supporting base for the energy-beam-curable viscoelastic layer 2 and as it, a material having heat resistance enough to prevent its mechanical physical properties from being impaired by heat treatment of the thermo-expandable pressure-sensitive adhesive layer 3 is employed. Examples of such a base material 1 include, but not limited to, plastic films or sheets made of polyester, olefin resin or polyvinyl chloride. The base material 1 is preferred to be cuttable by cutting means such as a cutter used upon cutting of an adherend. When a soft polyolefin film or sheet equipped with both heat resistance and stretchability is used as the base material 1, the base material through which a cutting blade is inserted upon cutting of a material to be cut can be stretched later so that use of it is suited for cut-piece-collecting system which needs space formation between cutting pieces. Since energy beams are employed for curing the energy-beam-curable viscoelastic layer 2, the base material 1 (thermo-expandable pressure-sensitive adhesive layer 3 or the like) must be composed of a material permitting transmission of at least a predetermined amount of energy beams. The base material 1 may be a single layer or a multi-layer. When the surface of the base material 1 is treated with a suitable releasant which will be described later, and the energy-beam-curable viscoelastic layer is formed over the treated surface, it is possible to thin the energy-beam-curable thermo-expandable pressure-sensitive adhesive sheet itself by irradiating it with energy beams to cure the energy-beam-curable viscoelastic layer and then peeling the base material 1.

Although the thickness of the base material 1 can be selected as needed within an extent not damaging the operation ease or working efficiency in each step such as adhesion of an adherend, cutting of the adherend, peeling and collection of cut pieces and the like, it is usually 500 µm or less, preferably about 3 to 300 µm, more preferably about 5 to 250 µm. In order to heighten adhesion with the adjacent layer and retention of the adhesion, the base material 1 may be subjected to ordinarily employed surface treatment, for example, chemical or physical treatment such as chromic acid treatment, exposure to ozone, exposure to a flame, exposure to a high-pressure electric shock or ionizing radiation, or coating with a undercoating agent (ex. a tacky substance which will be described later).

The energy-beam-curable viscoelastic layer 2 contains an energy-beam-curable compound (or energy-beam-curable resin) for imparting the layer with energy beam curability and at the same time, has viscoelasticity enough to relax the unevenness induced by thermo-expandable microspheres upon contact bonding with the thermo-expandable pressure-sensitive adhesive layer 3 (refer to an enlarged view of FIG. 1). The energy-beam-curable viscoelastic layer 2 which will be elastic after irradiation with energy beams is preferred. From such viewpoints, the energy-beam-curable viscoelastic layer 2 is desired to be composed of a composition obtained by adding an energy-beam-curable compound (or energy-beam-curable resin) to a parent material having viscoelasticity.

As the parent material, organic viscoelastic materials having desired viscoelasticity are usable. Examples include natural rubbers, synthetic rubbers and rubber adhesives using them, silicone rubbers or pressures-sensitive adhesives thereof, acrylic resins made of a homopolymer or copolymer of an alkyl (meth)acrylate [for example, (meth)acrylates of a $C_{1-20}$ alkyl such as methyl, ethyl, propyl, isopropyl, butyl, isobutyl, hexyl, octyl, 2-ethylhexyl, isooctyl, isodecyl or dodecyl], or a copolymer of the above-exemplified alkyl (meth)acrylate with another monomer [for example, a monomer containing a carboxyl group or an acid anhydride such as acrylic acid, methacrylic acid, itaconic acid, maleic acid, maleic acid, fumaric acid or maleic anhydride; a hydroxyl-containing monomer such as 2-hydroxyetrhyl (meth)acrylate, sulfonic-acid-containing monomer such as styrenesulfonic acid, a phosphoric-acid-containing monomer such as 2-hydroxyethylacryloyl phosphate, an amide-containing monomer such as (meth)acrylamide, an amino-containing monomer such as aminoethyl (meth)acrylate, an alkoxy-containing monomer such as methoxyethyl (meth)acrylate, an imide-containing monomer such as N-cyclohexyl maleimide, a vinyl ester such as vinyl acetate, a vinyl-containing heterocyclic compound such as N-vinylpyrrolidone, a styrene monomer such as styrene and α-methylstyrene, a cyano-containing monomer such as acrylonitrile, an epoxy-containing acrylic monomer such as glycidyl (meth)acrylate or vinyl ether monomer such as vinyl ether] or pressure-sensitive adhesives of the acrylic resin, polyurethane resins or pressure-sensitive adhesives thereof, and ethylene-vinyl acetate copolymers. Use of, as the parent material, components similar or analogous to the pressure-sensitive adhesive constituting the thermo-expandable pressure-sensitive adhesive layer 3 which will be described later makes it possible to stack the energy-beam-curable viscoelastic layer 2 and the thermo-expandable adhesive layer 3 with good adhesion. Preferred examples of the parent material include tacky substances such as acrylic pressure-sensitive adhesives. The parent material may be composed of either one component or plural components.

Although no particular limitation is imposed on the energy-beam-curable compound for energy beam curing of the energy-beam-curable viscoelastic layer 2 insofar as it is curable by energy beams such as visible rays, ultraviolet rays or electron beams, that permitting efficient three-dimensional network formation of the energy-beam-curable viscoelastic layer 2 after irradiation with energy beams is preferred. Energy-beam-curable compounds may be used either singly or in combination.

Specific examples of the energy-beam-curable compound include trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butyleneglycol diacrylate, 1,6-hexanediol diacrylate and polyethylene glycol diacrylate.

As the energy-beam-curable compound, energy-beam-curable resins may be employed. Examples of the energy-beam-curable resin include photosensitive-reactive-group-containing polymers or oligomers, for example, ester (meth) acrylate, urethane (meth)acrylate, epoxy (methacrylate), melamine (meth)acrylate and acrylic resin (meth)acrylate, each having a (meth)acryloyl group at the end of its molecule; thiol-ene addition type resins having, at the molecular end thereof, an allyl group; photo-cationic polymerization type resins; cinnamoyl-containing polymers such as polyvinyl cinnamate; diazotized amino-novolac resins; and acrylamide polymers. Examples of the polymer sensitive to high energy beams include epoxidated polybutadiene, unsaturated polyester, polyglycidyl methacrylate, polyacrylamide and polyvinyl siloxane. The above-described parent material is not always necessary when an energy-beam-curable resin is employed.

The energy-beam-curable compound is added, for example, in an amount of about 5 to 500 parts by weight, preferably about 15 to 300 parts by weight, more preferably about 20 to 150 parts by weight based on 100 parts by weight of the parent material. Excellent cutting operation and thermal releasability can be attained simultaneously when the energy-beam-curable viscoelastic layer 2 has a dynamic modulus of elasticity at 20° C. of $5 \times 10^6$ to $1 \times 10^{10}$ Pa (frequency: 1 Hz, sample: a film of 1.5 mm thick), in terms of storage shear modulus, after irradiation with energy beams. This storage modulus can be adjusted by selecting the kind or amount of the energy-beam-curable compound or conditions of irradiation with energy beams as needed.

In the energy-beam-curable viscoelastic layer 2, an energy beam polymerization initiator for curing the energy-beam-curable compound, and additives for imparting it with suitable viscoelasticity before and after curing by energy beams such as thermal polymerization initiator, crosslinking agent, tackifier and vulcanizing agent may be incorporated, in addition to the above-described components.

As the energy beam polymerization initiator, known or ordinarily employed polymerization initiators can be selected as needed depending on the kind of the energy beams to be used. Such energy beam polymerization initiators may be used either singly or in combination. The energy beam polymerization initiator is added in an amount of about 0.1 to 10 parts by weight, preferably about 1 to 5 parts by weight based on 100 parts by weight of the parent material. If necessary, an energy beam polymerization accelerator may be used in combination with the above-described energy-beam polymerization initiator.

The energy-beam-curable viscoelastic layer 2 can be formed in a conventional manner, for example, by applying a coating solution containing an energy-beam-curable resin or a parent material, an energy beam polymerizable compound and an energy beam polymerization initiator and, if necessary, an additive and a solvent onto a base material 1; or by applying the above-described coating solution onto a proper separator (release paper, etc.) to form an energy-beam-curable viscoelastic layer 2 and then transferring it to the base material 1.

The thickness of the energy-beam-curable viscoelastic layer 2 may be about 5 to 300 μm, preferably about 10 to 150 μm, more preferably about 15 to 100 μm from the viewpoints of relaxing the unevenness induced by thermo-expandable microspheres contained in the thermo-expandable pressure-sensitive adhesive layer 3 and preventing vibration due to a rotating blade upon cutting of the adherend.

The thermo-expandable pressure-sensitive adhesive layer 3 may contain a tacky substance for imparting it with tackiness and thermo-expandable microspheres for imparting it with thermo-expandable properties.

As the tacky substance, conventionally known pressure-sensitive adhesives are usable. Examples of the pressure-sensitive adhesive include rubber type pressure-sensitive adhesives such as natural rubbers and various synthetic rubbers, silicone type pressure-sensitive adhesives, and acrylic pressure-sensitive adhesives (for example, acrylic pressure-sensitive adhesives described as the parent material of the energy-beam-curable viscoelastic layer 2) such as copolymers of an alkyl (meth)acrylate and another unsaturated monomer copolymerizable with this ester. As the thermo-expandable pressure-sensitive adhesive layer 3, an energy-beam-curable pressure-sensitive adhesive may also be used. In this case, good releasability can be attained at a dynamic modulus of elasticity of $1 \times 10^5$ to $5 \times 10^7$ Pa (frequency: 1 Hz, sample: film of 1.5 mm thick) in terms of storage shear modulus after irradiation with energy beams within a temperature range initiating expansion of thermo-expandable microspheres.

As the thermo-expandable microspheres, usable are microspheres having a substance, which is easily gasified and expands by heating, such as isobutane, propane or pentane enclosed in an elastic shell. The shell is usually made of a thermoplastic substance, hot melt substance or a substance which is broken by thermal expansion. Examples of the shell forming substance include vinylidene chloride-acrylonitrile copolymer, polyvinyl alcohol, polyvinyl butyral, polymethyl methacrylate, polyacrylonitrile, polyvinylidene chloride and polysulfone. Thermo-expandable microspheres can be prepared by a conventional manner such as coacervation or interfacial polymerization. A commercially available product such as Matsumoto Microsphere [trade name; product of Matsumoto Yushi-Seiyaku Co., Ltd.] can also be used as the thermo-expandable microspheres.

The average particle size of the thermo-expandable microspheres is usually about 1 to 80 μm, preferably about 4 to 50 μm in consideration of dispersibility and thin-film formation. In order to efficiently lower the adhesion of the pressure-sensitive adhesive layer including the adhesive by heating, the thermo-expandable microspheres preferably have a sufficient strength not to be broken until the volumetric expansion ratio becomes 5 times or greater, particularly 10 times or greater. When the thermo-expandable microspheres broken at a low expansion coefficient or a thermo-expandable agent not microencapsulated is employed, an adhesion area between the pressure-sensitive adhesive layer 3 and adherend is not reduced sufficiently, leading to unfavorable releasability.

Although the amount of the thermo-expandable microspheres depends on their kind, it is, for example, 10 to 200 parts by weight, preferably about 20 to 125 parts by weight based on 100 parts by weight of the adhesive base polymer constituting the thermo-expandable pressure-sensitive adhesive layer 3. Amounts less than 10 parts by weight lead to insufficient reduction in adhesion after heating, while amounts exceeding 200 parts by weight tend to cause cohesive failure of the thermo-expandable pressure-sensitive adhesive layer 3 or interfacial fracture between the energy-beam-curable viscoelastic layer 2 and thermo-expandable pressure-sensitive adhesive layer 3.

The thermo-expandable pressure-sensitive adhesive layer 3 may contain, in addition to the adhesive and thermo-expandable microspheres, additives such as a crosslinking agent (for example, isocyanate crosslinking agent or epoxy crosslinking agent), tackifier (for example, rosin derivative resin, polyterpene resin, petroleum resin or oil-soluble phenol resin), plasticizer, filler, antioxidant and surfactant as needed.

The thermo-expandable pressure-sensitive adhesive layer 3 can be formed by a proper method, for example, by directly applying a coating solution containing the adhesive and thermo-expandable microspheres and optionally, an additive and a solvent onto the energy-beam-curable viscoelastic layer 2, followed by contact bonding via a separator 4; or applying the above-described coating solution onto a suitable separator (release paper, etc.) 4 to form the thermo-expandable pressure-sensitive adhesive layer 3, followed by transfer onto the energy-beam-curable viscoelastic layer 2 by contact bonding.

Although the thickness of the thermo-expandable pressure-sensitive adhesive layer 3 can be determined as needed depending on the using purpose of the pressure-sensitive adhesive sheet or lowering degree of the adhesion by heating, it is preferred to set it not greater than the maximum diameter of the thermo-expandable microspheres in order to maintain surface smoothness. For example, the thermo-expandable pressure-sensitive adhesive layer 3 has a thickness of 1 to 100 μm, preferably 3 to 50 μm, more preferably 5 to 20 μm. A too thin thermo-expandable pressure-sensitive adhesive layer 3 happens to fail in supporting the adherend because of insufficient adhesion.

As the separator 4, usable are a base material made of a plastic film or paper having a surface coated with a releasant typified by a silicone resin, a long-chain alkyl acrylate resin or fluorine resin; and a base material made of a non-polar polymer such as polyethylene or polypropylene and having small adhesion.

The separator 4 serves as a temporary support upon contact bonding and transfer of the thermo-expandable pressure-sensitive adhesive layer 3 onto the energy-beam-curable viscoelastic layer 2 or as a protector of the thermo-expandable pressure-sensitive adhesive layer 3 until practical use.

The energy-beam-curable viscoelastic layer 2 and the thermo-expandable pressure-sensitive adhesive layer 3 disposed thereon can be formed not only one side but both sides of the base material 1. Alternatively, the energy-beam-curable viscoelastic layer 2 and the thermo-expandable pressure-sensitive adhesive layer 3 are stacked on one side of the base material 1 one after another, while a conventional pressure-sensitive adhesive layer is disposed on the opposite side. A pressure-sensitive adhesive layer can be disposed on the thermo-expandable pressure-sensitive adhesive layer 3 for preventing minute cohesive failure on the interface with an adherend which will otherwise occur owing to roughening of the thermo-expandable pressure-sensitive adhesive layer 3 upon heating. As tacky substance for this pressure-sensitive adhesive layer, adhesives as exemplified in the thermo-expandable pressure-sensitive adhesive layer 3 are usable. The thickness of the pressure-sensitive adhesive layer is preferably 0.1 to 8 μm, especially 1 to 5 μm in consideration of a reduction or loss of adhesion to the adherend and this layer can be formed in accordance with that employed for the thermo-expandable pressure-sensitive adhesive layer 3.

FIG. 2 is a schematic cross-sectional view illustrating another example of the energy-beam-curable thermal-releasable pressure-sensitive adhesive sheet of the present invention. In this example, an energy-beam-curable viscoelastic layer 2, thermo-expandable pressure-sensitive adhesive layer 3 and separator 4 are stacked in this order over one side of a base material 1, while a pressure-sensitive adhesive layer 5 and a separator 6 are stacked over the opposite side of the base material 1. This pressure-sensitive adhesive sheet differs from that of FIG. 1 only in disposal of the pressure-sensitive adhesive layer 5 and separator 6 on the side opposite to the side of the base material 1 having the energy-beam-curable viscoelastic layer 2 and the thermo-expandable pressure-sensitive adhesive layer 3 formed thereon.

The pressure-sensitive adhesive layer 5 contains a tacky substance. As this substance, those exemplified as the tacky substance in the thermo-expandable pressure-sensitive adhesive layer 3 are usable. If necessary, an additive such as crosslinking agent (for example, an isocyanate crosslinking agent or epoxy crosslinking agent), tackifier (for example, a rosin derivative resin, polyterpene resin, petroleum resin or oil-soluble phenol resin), plasticizer, filler, antioxidant or surfactant may be added. It is not preferred to use or add a substance markedly disturbing the transmission of energy beams for curing the energy-beam-curable viscoelastic layer 2.

Although the thickness of the pressure-sensitive adhesive layer 5 can be determined as needed within an extent not impairing operation ease upon contact bonding of the thermo-expandable pressure-sensitive adhesive layer 3 with an adherend, cutting of the adherend, release and collection of cut pieces, it is usually about 1 to 50 μm, preferably 3 to 30 μm.

The pressure-sensitive adhesive layer 5 can be formed in accordance with that employed for the thermo-expandable pressure-sensitive adhesive layer 3. As the separator 6, that similar to the separator 4 disposed on the thermo-expandable pressure-sensitive adhesive layer 3 is usable. Such a pressure-sensitive adhesive sheet can be fixed to the surface of a seat by making use of its adhesive layer 5.

FIG. 3 is a schematic view illustrating one example of the manufacturing process of cut pieces of the present invention. More specifically, illustrated in FIG. 3 are cross-sectional views of a series of steps of causing a material to be cut (adherend) 7 to adhere onto the surface of the thermo-expandable pressure-sensitive adhesive layer 3 of the energy-beam-curable thermal-releasable pressure-sensitive adhesive sheet of FIG. 1 (from which the separator 4 has been released) by contact bonding, curing the energy-beam-curable viscoelastic layer 2 by irradiation with energy beams 8, cutting the adherend along a cutting line 9 into pieces of a predetermined size, expanding and foaming thermo-expandable microspheres in the thermo-expandable pressure-sensitive adhesive layer 3 by heating and then peeling and collecting the cut pieces 7a. Alternatively, after curing the energy-beam-curable viscoelastic layer 2 by irradiation with the energy beams 8, the material to be cut (adherend) 7 is caused to adher onto the surface of the thermo-expandable pressure-sensitive adhesive layer 3 by contact bonding, followed by cutting along the cutting line 9.

In FIG. 3, indicated at numeral 1 is a base material, 2a an energy-beam-curable viscoelastic layer cured by irradiation with energy beams and 3a a thermo-expandable pressure-sensitive adhesive layer after the thermo-expandable microspheres are expanded by heating after irradiation with energy beams.

The contact bonding of the thermo-expandable pressure-sensitive adhesive layer 3 of the energy-beam-curable thermal-releasable pressure-sensitive adhesive sheet with the adherend 7 can be carried out, for example, by contact bonding using proper pressing means such as rubber roller, laminating roll or pressing machine. Upon contact bonding, heating at a temperature within a range not permitting expansion of the thermo-expandable microspheres or activation of a tacky substance by application of water or an organic solvent may be carried out as needed depending on the type of the tacky substance.

As the energy beams 8, visible rays, ultraviolet rays and electron beams may be used. Irradiation with the energy beams 8 may be carried out by a suitable method, but to prevent starting of expansion of the thermo-expandable microspheres due to heat upon irradiation, it is desired to suppress an irradiation time as short as possible or to air cool the radiation-curable thermal-releasable pressure-sensitive adhesive sheet to keep the temperature not to initiate expansion of the thermo-expandable microspheres.

The adherend 7 can be cut by conventional cutting means such as dicing. Heating conditions can be set as needed depending on the surface conditions or heat resistance of the adherend 7 (or cut pieces 7a)), kind of the thermo-expandable microspheres, heat resistance of the pressure-sensitive adhesive sheet or heat capacity of the adherend (material to be cut). Heating is usually conducted under conditions at 350° C. or less for 30 minutes or less, with conditions at 80 to 200° C. for 1 second to 15 minutes being particularly preferred. Hot air heating, hot plate contacting or infrared ray heating can be employed as a heating method, but is not limited particularly.

When the base material 1 of the pressure-sensitive adhesive sheet has stretchability, stretching can be conducted using conventional stretching means employed for secondary stretching of a sheet.

Since the energy-beam-curable thermal-releasable pressure-sensitive adhesive sheet of the present invention has the thermo-expandable pressure-sensitive adhesive layer 3 containing a tacky substance (adhesive), the adherend 7 can be bonded and maintained firmly thereto and it is not released by vibration upon transport. Since the thermo-expandable pressure-sensitive adhesive layer 3 can be thinned and at the same time, the energy-beam-curable viscoelastic layer 2 is cured by irradiating with energy beams prior to cutting, the resulting sheet can be cut into a predetermined size while reducing winding up of the pressure-sensitive adhesive layer caused by a cutting blade or chipping caused by vibration of the pressure-sensitive adhesive layer, compared with the conventional thermo-expandable pressure-sensitive adhesive sheet. When the thermo-expandable pressure-sensitive adhesive layer 3 containing thermo-expandable microspheres and therefore having thermal expansion properties is heated after cutting, these thermo-expandable microspheres rapidly foam or expand, causing a volumetric change of the thermo-expandable pressure-sensitive adhesive layer 3. By the resulting three-dimensional structure in the uneven form, an adhesion area of the thermo-expandable pressure-sensitive adhesive layer 3 with the cut pieces 7a decreases largely, leading to lowering or loss of adhesion strength. The curing of the energy-beam-curable viscoelastic layer 2 by irradiation with energy beams and a marked reduction or loss of adhesion strength by heat treatment bring about marked improvements in operation ease or working efficiency in cutting of the adherend 7 and peeling and collection of the cut pieces 7a and also in production efficiency.

The energy-beam-curable thermal-releasable pressure-sensitive adhesive sheet of the invention is of course usable for permanent adhesion of an adherend, but it is suited for use in the case where release from adhesion is requested or desired after a predetermined time of adhesion and attainment of the adhesion purpose. Specific examples of such a using purpose include, as well as a fixing material to a semiconductor wafer or ceramic multilayer sheet, a carrier tape, temporary tacking material or fixing material used upon transport of parts or temporary tacking upon fabrication of various electrical apparatuses, electron devices or displays, and a surface protecting or masking material for protecting a metal plate, plastic plate or glass plate from contamination or damage. Particularly in a manufacturing step of electron parts, it is suitably used for production of small or thin-layer semiconductor chips or multilayer capacitor chips.

This application is based on a Japanese patent application JP 2000-318644, filed Oct. 18, 2000, the entire content of which is hereby incorporated by reference, the same as if set forth at length.

The present invention will hereinafter be described in further detail by examples. It should however be borne in mind that the invention is not limited to or by these examples.

EXAMPLE 1

A mixed solution 1 was prepared by incorporating 0.8 part by weight of an epoxy crosslinking agent, 70 parts by weight of six-functional ultraviolet-ray polymerizable compound and 3 parts by weight of a ultraviolet ray polymerization initiator 3 in 100 parts by weight of an acrylic copolymer (weight-average molecular weight: 700000) composed of 60 parts by weight of ethyl acrylate, 40 parts by weight of butyl acrylate and 4 parts by weight of acrylic acid. The resulting mixed solution was applied to a corona treated surface of a polyester film (base material) of 50 μm thick, followed by drying, whereby an acrylic ultraviolet-ray-curable viscoelastic layer of 45 μm thick was formed.

A mixed solution 2 composed of 25 parts by weight of thermo-expandable microspheres ("Matsumoto Microspheres F-50D", trade name; product of Matsumoto Yushi-Seiyaku Co., Ltd.) and 0.5 part by weight of an epoxy crosslinkig agent based on 100 parts by weight of the above-described acrylic copolymer (adhesive) was applied to the silicone-releasant-treated surface of a polyester film (separator), followed by drying, whereby a thermo-expandable pressure-sensitive adhesive layer (thermal-releasable pressure-sensitive adhesive layer) of 20 μm thick was formed.

The thermo-expandable pressure-sensitive adhesive layer was bonded to the acrylic ultraviolet-ray-curable viscoelastic layer by contact bonding, whereby a ultraviolet-ray-curable thermal-releasable pressure-sensitive adhesive sheet was obtained.

COMPARATIVE EXAMPLE 1

In a similar manner to Example 1 except that the ultraviolet-ray-curable viscoelastic layer was formed to give a thickness of 65 μm and the thermo-expandable pressure-sensitive adhesive layer was not disposed, an ultraviolet-ray-curable pressure-sensitive adhesive sheet was obtained.

COMPARATIVE EXAMPLE 2

A mixed solution 2 prepared in a similar manner to Example 1 was applied to the corona treated surface of a polyester film (base material) of 50 μm thick, followed by drying, whereby a thermal-releasable pressure-sensitive adhesive sheet having an adhesive layer of 65 μm thick was obtained.

EXAMPLE 2

A mixed solution 3 was prepared by incorporating 3 parts by weight of an energy-beam polymerization initiator in 100 parts by weight of an energy-beam reactive polymer (weight-average molecular weight: 600000) obtained by adding, to an acrylic copolymer composed of 75 parts by weight of ethyl acrylate, 20 parts by weight of butyl acrylate, 5 parts by weight of methyl methacrylate and 20 parts by weight of 2-hydroxyethyl acrylate, methacryloyloxyethyl isocyanate in an amount of 0.9 equivalent (molar ratio) of the 2-hydroxyethyl group. In a similar manner to Example 1 except for the use of this mixed solution, an energy-beam-curable viscoelastic layer of 40 μm thick was formed.

In a similar manner to Example 1 except for the use of a mixed solution 4 obtained by incorporating 30 parts by weight of thermo-expandable microspheres ("Matsumoto Microspheres F-SOD", trade name; product of Matsumoto Yushi-Seiyaku Co., Ltd.) and 2.5 part by weight of an isocyanate crosslinking agent in 100 parts by weight of an acrylic copolymer composed of 75 parts by weight of ethyl acrylate, 20 parts by weight of butyl acrylate, 5 parts by weight of methyl acrylate and 5 parts by weight of 2-hydroxyethyl acrylate, a thermo-expandable pressure-sensitive adhesive layer of 15 μm thick was formed.

The thermo-expandable pressure-sensitive adhesive layer was contact-bonded to the energy-beam-curable viscoelastic layer by a laminator, whereby an energy-beam-curable thermal-releasable pressure-sensitive adhesive sheet was obtained.

Evaluation Test

After contact bonding of a polyester film ("Lumirror S10", trade name; product of Toray Industries, Inc.) on the surface of the pressure-sensitive adhesive layer of each of the pressure-sensitive adhesive sheets (20 mm wide) obtained in Examples and Comparative Examples, 180° peel adhesion (N/20 mm, peeling rate: 300 mm/min, 23° C.) before treatment, after irradiation with ultraviolet rays and after heat treatment following the irradiation were measured. Ultraviolet rays was irradiated from the side of the pressure-sensitive adhesive sheet for 10 seconds by using an air-cooling type high-pressure mercury lamp (46 mJ/min) (only Example 1 and Comparative Example 1), while the heat treatment was conducted in a hot air drier of 130° C. for 5 minutes (only Example 1 and Comparative Example 2).

Each of the pressure-sensitive adhesive sheets obtained in Examples and Comparative Examples were bonded to a semiconductor wafer of 160 μm thick. After irradiation with ultraviolet rays, dicing (dicing speed: 80 mm/min, the rotation frequency of a blade: 40000 rpm, depth of cut of a polyester film: 20 μm, chip size: 5 mm×5 mm) was conducted using a dicer ("DFD651", product of DISCO Corporation). The presence or absence of winding up of the adhesive was visually confirmed. In addition, from each of the laminate, as was, of Comparative Example 1 and from the laminates, after heating, of Example 1 and Comparative Example 2, 20 chips were picked up at random. The chips cracked upon picking up were regarded as defectives. Moreover, chipping on the side surface of the crack-free chips, that is, non-defectives was observed by an optical microscope and those having chipping of 40 μm or greater in the depth direction were regarded as defectives. Irradiating with ultraviolet rays and heating were conducted under similar conditions to those described above.

Evaluation results are shown in Table 1. In none of Examples and Comparative Examples, adhesive transfer to a peeled polyester film or chip was visually observed upon peeling by heating.

TABLE 1

|  | Ex. 1 | Comp. Ex. 1 | Comp. Ex. 2 | Ex. 2 |
|---|---|---|---|---|
| Adhesion (N/20 mm) | | | | |
| Before treatment | 4.10 | 4.60 | 4.00 | 5.80 |
| After irradiation with ultraviolet rays | 2.30 | 0.50 | — | 2.00 |
| After irradiation with ultraviolet rays and heat treatment | 0.00 | — | 0.00 | 0.00 |
| Winding up of adhesive | None | None | Found | None |
| Cracks (the number of defectives/20 chips) | 0/20 | 7/20 | 0/20 | 0/20 |
| Chipping (the number of defectives/20 chips) | 1/20 | 0/20 | 12/20 | 0/20 |

As is apparent from Table 1, in the pressure-sensitive adhesive sheet of each of Examples, curing of the ultraviolet ray curable viscoelastic layer by irradiation with ultraviolet rays causes appropriate lowering in the adhesion of the pressure-sensitive adhesive layer, and winding up of the adhesive and shear of a blade upon cutting can be prevented because the pressure-sensitive adhesive layer can be formed thin. The adhesion disappears by heat treatment, whereby cracks of chips upon picking up can be prevented. In the pressure-sensitive adhesive sheet of Comparative Example 1, on the other hand, irradiation with ultraviolet rays also lowers adhesion largely, causing chip scattering and due to residual adhesion, cracks appeared upon picking up. In the pressure-sensitive adhesive sheet of Comparative Example 2, no cracks occurred but an yield of chipping-free products, that is, non-defectives was low because the pressure-sensitive adhesive layer was soft and thick.

INDUSTRIAL APPLICABILITY

The energy-beam-curable thermal-releasable pressure-sensitive adhesive sheet according to the invention has enough adhesion to withstand transport of an adherend, is suppressed in winding up or chipping of the adhesive upon cutting, and facilitates release and collection of pieces cut with high precision. This makes it possible to markedly heighten operation ease and working efficiency in the peeling and collecting step of the cut pieces and in turn, drastically improving the productivity of cut pieces such as small-size or thin-layer semiconductor chips or multilayer capacitor chips.

The invention claimed is:

1. An energy-beam-curable thermal-releasable pressure-sensitive adhesive sheet comprising: a base material, an energy-beam-curable viscoelastic layer; and a thermo-expandable pressure-sensitive adhesive layer comprising thermo-expandable microspheres, in this order, wherein the energy-beam-curable viscoelastic layer comprises a composition having an organic viscoelastic body, an energy-beam-curable compound and an energy-beam polymerization initiator.

2. The energy-beam-curable thermal-releasable pressure-sensitive adhesive sheet according to claim 1, wherein the energy-beam-curable viscoelastic layer comprises a tacky substance.

3. The energy-beam-curable thermal-releasable pressure-sensitive adhesive sheet according to claim 1, wherein the energy-beam-curable viscoelastic layer has a thickness of 5 to 300 μm.

4. The energy-beam-curable thermal-releasable pressure-sensitive adhesive sheet according to claim 1, wherein the energy-beam-curable viscoelastic layer after irradiating with energy beams has a storage shear modulus at 20° C. falling within a range of from $5 \times 10^6$ to $1 \times 10^{10}$ Pa.

5. The energy-beam-curable thermal-releasable pressure-sensitive adhesive sheet according to claim 1, wherein the thermo-expandable pressure-sensitive adhesive layer has a thickness not greater than the maximum particle size of the thermo-expandable microspheres.

6. A method for producing cut pieces, which comprises:
applying a material to be cut on a surface of the thermo-expandable pressure-sensitive adhesive layer of the energy-beam-curable thermal-releasable pressure-sensitive adhesive sheet according to claim 1;
curing the energy-beam-curable viscoelastic layer by irradiating with energy beams;
cutting the material into cut pieces;
heating the thermo-expandable pressure-sensitive adhesive layer so as to foam; and
releasing and collecting the cut pieces from the energy-beam-curable thermal-releasable pressure-sensitive adhesive sheet.

7. A method for producing cut pieces, which comprises:
irradiating the energy-beam-curable thermal-releasable pressure-sensitive adhesive sheet according to claim 1 with energy beams, so as to cure the energy-beam-curable viscoelastic layer, applying a material to be cut on a surface of the thermo-expandable pressure-sensitive adhesive layer,
cutting the material into cut pieces,
heating the thermo-expandable pressure-sensitive adhesive layer to foam; and releasing and collecting the cut pieces from the energy-beam-curable thermal-releasable pressure-sensitive adhesive sheet.

* * * * *